(12) United States Patent
Wu (10) Patent No.: US 6,545,903 B1
(45) Date of Patent: Apr. 8, 2003

(54) SELF-ALIGNED RESISTIVE PLUGS FOR FORMING MEMORY CELL WITH PHASE CHANGE MATERIAL

(75) Inventor: Zhiqiang Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/023,392

(22) Filed: Dec. 17, 2001

(51) Int. Cl.$^7$ .............................................. G11C 11/00
(52) U.S. Cl. ...................................... 365/148; 365/163
(58) Field of Search .................................. 365/148, 163

(56) References Cited

U.S. PATENT DOCUMENTS

| | | | |
|---|---|---|---|
| 3,271,591 A | 9/1966 | Ovshinsky | 327/500 |
| 3,530,441 A | 9/1970 | Ovshinsky | 365/113 |
| 4,499,557 A | 2/1985 | Holmberg et al. | 365/163 |
| 4,599,705 A | 7/1986 | Holmberg et al. | 365/163 |
| 5,166,758 A | 11/1992 | Ovshinsky et al. | 257/3 |
| 5,714,768 A | 2/1998 | Ovshinsky et al. | 257/40 |
| 5,825,046 A | 10/1998 | Czubatyj et al. | 257/2 |
| 5,912,839 A | 6/1999 | Ovshinsky et al. | 365/185.03 |
| 5,933,365 A | 8/1999 | Klersy et al. | 365/148 |
| 6,075,719 A | 6/2000 | Lowrey et al. | 365/148 |
| 6,087,674 A | 7/2000 | Ovshinsky et al. | 257/2 |
| 6,141,241 A | 10/2000 | Ovshinsky et al. | 365/163 |
| RE37,259 E | 7/2001 | Ovshinsky | 365/63 |
| 6,423,621 B2 * | 7/2002 | Doan et al. | 438/597 |
| 6,440,837 B1 * | 8/2002 | Harshfield | 438/618 |

* cited by examiner

*Primary Examiner*—M. Tran
(74) *Attorney, Agent, or Firm*—Jacqueline J. Garner; W. James Brady, III; Frederick J. Telecky, Jr.

(57) ABSTRACT

Memory devices are disclosed for storage and retrieval of information, wherein resistive plugs are provided above and below a phase change material to form a memory cell. The plugs may be formed by implanting regions in high resistivity material above and below a phase change material layer to lower the resistivity in the implanted regions.

23 Claims, 9 Drawing Sheets

SELF-ALIGNED RESISTIVE PLUGS FOR FORMING MEMORY CELL WITH PHASE CHANGE MATERIAL

FIELD OF INVENTION

The present invention relates generally to semiconductor devices and more particularly to phase change material memory cells and methods for fabricating phase change material memory cells.

BACKGROUND OF THE INVENTION

Phase change materials are alloys in which the structural states of the material may be electrically switched between generally amorphous and generally crystalline local order in a controlled fashion. In these materials, the crystalline state is known to have a lower resistivity than the amorphous state. Such materials are sometimes used to form memory storage devices, for example, where the structural state of the material is indicative of data or other information stored in a particular cell. In some such phase change memory cells, binary data may be stored where the low resistivity crystalline state is used to indicate a binary "0" and the higher resistivity amorphous state indicates a binary "1" or vice versa. The nature of phase change materials also allows controlled setting or "programming" of the material state to one or more intermediate states or local orders between the completely amorphous and completely crystalline states. This characteristic allows use of these materials in other (e.g., non-binary) memories. In this regard, the electrical switching of such materials need not take place between completely amorphous and completely crystalline states. Rather, the electrical switching may be performed in incremental steps so as to provide a "gray scale" represented by a multiplicity of conditions of local order along a range between the completely amorphous and the completely crystalline states.

Another feature of phase change materials is the ability to program memory cells without first having to erase the cell. For instance, in a binary phase change material memory cell, the cell may be programmed directly to either a "1" or to a "0", regardless of the previous state. In programming memory cells constructed of phase change material, an electrical current of sufficient magnitude is passed through the material, usually in the form of a pulse of limited time duration and controlled magnitude. The programming current causes thermal and/or electrically induced structural changes in the material in order to set the structure to a given state (e.g., completely amorphous, completely crystalline, or an intermediate state). As programming current flows, the phase change material melts into an amorphous state, regardless of the initial state. Where a relatively short duration current pulse is applied, the material cools quickly, and remains in a generally amorphous state. This effectively sets or "programs" the cell material to a electrical high resistivity (e.g., a binary "1", for example).

Alternatively, where a longer duration pulse is used, the material cools more slowly, and transitions into a generally crystalline state having a relatively low resistivity (e.g., used to indicate a binary "0"). By controlling the pulse duration and the current magnitude, therefore, the memory cell having such phase change material may be programmed or set to either an amorphous or crystalline state in order to function as a binary data store. In this regard, the duration and current amplitude may further be controlled or varied so as to achieve any desired final state (e.g., after cooling), by which non-binary information storage may be achieved. The cell may thereafter be read by applying a current pulse of lower magnitude (e.g., low enough to prevent material melting), by which the resistivity of the cell material (e.g., and hence the value of the data stored or programmed therein) can be ascertained.

Figure 1A:
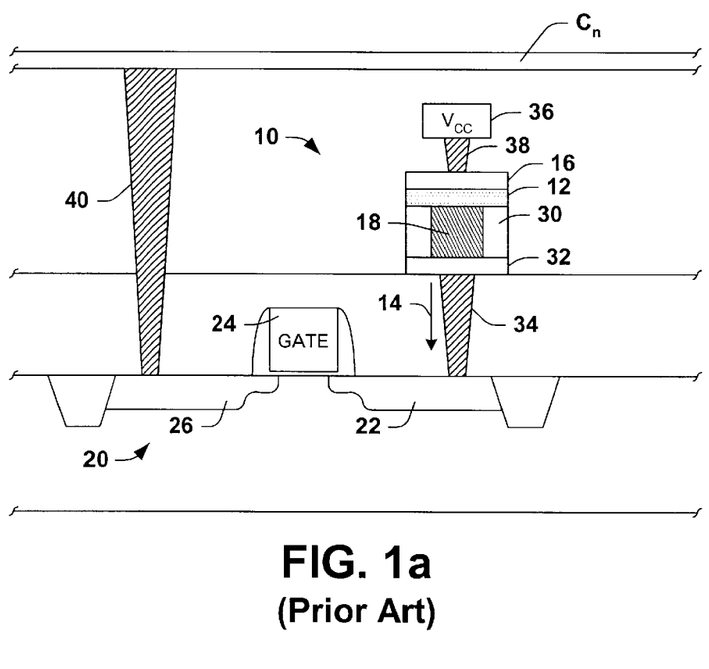
FIGS. 1a and 1b are partial side elevation views in section of a conventional phase change material memory cell in a semiconductor memory device.
Figure 1B:
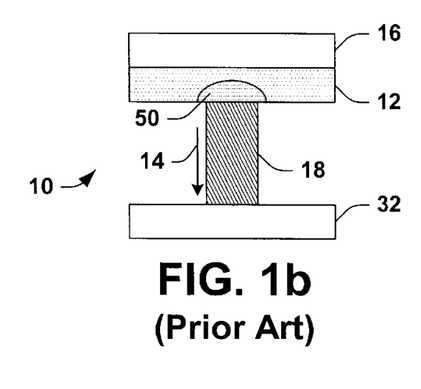

A conventional phase change material memory cell 10 is illustrated in FIGS. 1a and 1b, having a volume of phase change material 12 of the type described above, which goes through a state change depending upon a current 14 passing therethrough. The cell 10 is connected to a MOSFET type transistor 20 formed in a semiconductor memory device 2 for programming and reading of the cell 10. The phase change material 12 is situated between an overlying conductive contact 16 and an underlying resistive structure or plug 18 laterally surrounded by a high resistivity material 30. The plug 18 and the material 30 are formed over another conductive contact 32, which in turn, is connected to a source/drain structure 22 of the transistor 20 by a conductive via structure 34. The upper contact 16 is connected to a power supply rail connection 36 (e.g., $V_{CC}$ in FIG. 1a) by another via structure 38, from which programming and/or read current is selectively derived using the transistor 20.

The transistor 20 further includes a gate 24 and a second source/drain structure 26 connected to a column select line contact $C_n$ using a via structure 40. The column line $C_n$ is selectively used to conduct current from the power supply contact 36 through the cell material 12, the resistor plug 18, and the transistor 20 by connection to a power ground using one or more control transistors (not shown), by which the memory cell 10 and the state of the phase change material 12 may be programmed (e.g., written) and/or read. Such operations are performed on the cell 10 when the transistor 20 conducts between the source/drain regions 22 and 26, according to a signal at the gate 24. The gate 24 is controlled by row select logic (not shown) in the memory device 2, by which the cell 10 (e.g., and other cells in a logical row connected to the same row select logic signal) is operated on.

As illustrated in FIG. 1b, when a current 14, such as a programming current pulse, is applied to the cell 10, which passes through the resistive plug 18, heating of the phase change material 12 results near the interface between the material 12 and the plug 18 in a localized region 50 in the volume of material 12. One problem with the use of a single resistive plug 18 in the design of the memory cell 10 is the localized nature of the area or region 50 affected by the heating of the resistive plug 18. Although the plug 18 generates some amount of heat, the heating effect is somewhat inefficient because it is only localized to the bottom of the phase change material 12 in region 50.

It is noted in FIGS. 1a and 1b, that the volume of the affected phase change material in the region 50 determines how much resistivity difference results between the programmed and unprogrammed states (e.g., between the amorphous and crystalline states in a binary memory). Thus, it is desirable to impact a greater volume of phase change material by the heating (e.g., in region 50) to make it easier to differentiate between the binary states (e.g., or between any number of achievable states in a non-binary memory structure). For a given programming current level (e.g., or more generally for a given amount of applied energy), an improvement in the heat delivery over that provided by the single resistive plug 18 would allow a greater volume of phase change material 12 being programmed. Alternatively or in combination, less energy could be applied to achieve the same amount of affected material in the region 50. Thus, it is seen that a need exists for improving the energy transfer efficiency of phase change material memory cell programming operations.

It is also noted in FIGS. 1a and 1b that the structure of the conventional memory cell 10 has a further disadvantage. While a programming current 14 is applied to the cell 10, the underlying resistive plug 18 acts as a heat source to apply heat to the phase change material in the region 50. However, at the same time, the upper conductive contact 16 acts as a heat sink, drawing heat energy away from the phase change material 12. This is because the conductive contact 16 is highly conductive, both electrically and thermally (e.g., the contact 16 is typically fashioned from metal). Thus, in order to extend the affected region 50 upwards (e.g., to improve device reliability), it is necessary to apply even more energy via the current pulse 14. Consequently, there remains a need for improved phase change material memory cell structures and techniques for fabricating such memory devices, by which the above mentioned shortcomings associated with conventional devices can be mitigated or overcome.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to memory cell devices and fabrication techniques where resistive plugs are formed above and below a phase change material to form a memory cell in a semiconductor memory device, by which the above mentioned and other difficulties can be mitigated or overcome. The plugs may be formed by implanting regions in high resistivity material above and below a phase change material layer to lower the resistivity in the implanted regions, and may be formed using a single implantation so as to facilitate alignment of the plugs with respect to one another.

One aspect of the invention involves semiconductor memory devices and memory cells therefore, comprising a volume of phase change material disposed in a semiconductor device with upper and lower surfaces, such as in the form of a film layer. The phase change material volume, which may be deposited using an electrically switchable chalcogenide alloy formed of antimony, tellurium, and germanium, for example, comprises a memory region extending between an upper portion of the upper surface and a lower portion of the lower surface. A first high resistivity material at least partially overlies the volume of phase change material, which has a first intermediate resistivity portion or plug contacting the memory region. In addition, a second high resistivity material at least partially underlies the volume of phase change material, with a second intermediate resistivity portion or plug contacting the memory region.

Phase change material in the memory region and the first and second intermediate resistivity portions form an electrical path for storage and retrieval of information in the memory cell. The heating effect of the upper and lower resistive plugs facilitates improved uniformity of heat transfer into the phase change material in the memory region, and hence may be employed to improve memory cell reliability, to improve the ability to differentiate between programmed states, and to reduce the amount of energy required to program the cell. Furthermore, the use of upper and lower resistive plugs mitigates the heat sink effect of prior designs where a conductive contact would draw programming energy away from the phase change material. In this respect, the invention further improves the thermal and electrical efficiency of programming operations associated with phase change material memory cells.

Conductive contact structures may be provided above the first (e.g., upper) intermediate resistivity portion or plug, as well as beneath the second resistive plug, such that application of a voltage across the first and second conductive contact structures causes a current to flow in the phase change material in the memory region and the first and second intermediate resistivity portions. One or both of the intermediate resistivity portions or plugs may comprise high resistivity material implanted with at least one of boron, arsenic, and phosphorus. In this way, the resistivity associated with the implanted portion(s) is less than that of the non-implanted high resistivity materials, creating a current channel or path. The upper and lower (e.g., first and second) intermediate resistivity plugs, moreover, may be aligned with one another along a vertical axis, so as to improve the efficiency and reliability of the cell.

Another aspect of the invention provides methodologies for fabricating a memory cell in a semiconductor memory device. The methods comprise depositing a first conductive contact layer over a substrate and depositing a first high resistivity layer over the first conductive contact layer, such as using undoped polysilicon or amorphous silicon. A volume of phase change material is deposited (e.g., such as a chalcogenide alloy formed of antimony, tellurium, and germanium, or the like) over the first high resistivity layer, which comprises a memory region in which a portion of the volume of phase change material extends between generally planar upper and lower surfaces of the volume of phase change material. The methodology further comprises depositing a second high resistivity layer over the volume of phase change material and depositing a second conductive contact layer over the second high resistivity layer.

In addition, the method comprises forming a first intermediate resistivity portion in the first high resistivity layer substantially beneath the memory region, and forming a second intermediate resistivity portion in the second high resistivity layer substantially above the memory region. The intermediate resistivity portions or plugs may be created by reducing first and second resistivities associated with the first and second intermediate resistivity portions of the first and second high resistivity layers, respectively, such as through implanting boron, arsenic, and/or phosphorus in the first and second intermediate resistivity portions using one or more implantation processes.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention relates to memory devices and memory cells therefor for storage and retrieval of information, wherein resistive plugs are provided above and below a phase change material to form the memory cells. The plugs may be formed by implanting regions in high resistivity material above and below a phase change material layer to lower the resistivity in the implanted regions. Several exemplary phase change material memory cell structures are illustrated and described below. However, it is to be appreciated that other structures are possible within the scope of the appended claims, including structures not illustrated or described herein.

Figure 2A:
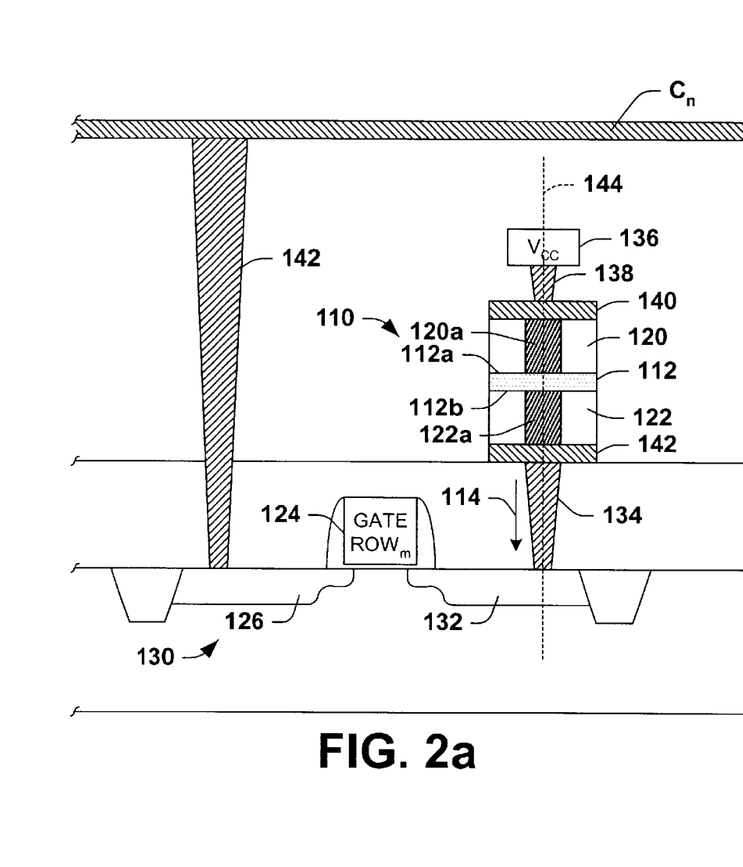
FIGS. 2a and 2b are partial side elevation views in section illustrating an exemplary phase change material memory cell in a semiconductor memory device in accordance with the present invention.
Figure 2B:
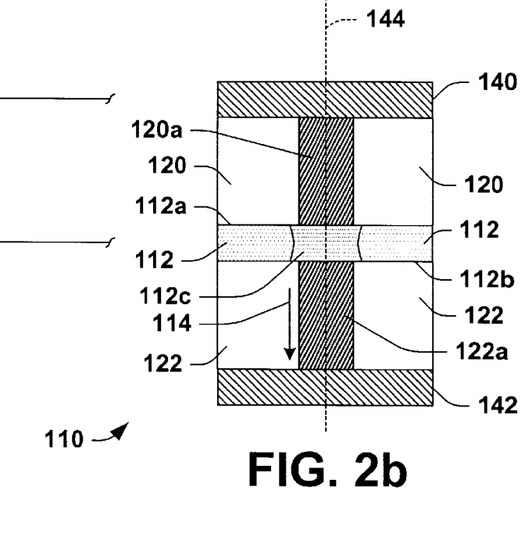

Referring initially to FIGS. 2a and 2b, a memory cell 110 is illustrated in accordance with the invention for storage and retrieval of information in a semiconductor memory device 102. The cell 110 comprises a volume of phase change material 112 disposed in the device 102 in a generally horizontal plane with generally planar upper and lower surfaces 112a and 112b, respectively. The volume 112, as well as other structures in the cell 110, may be formed in any appropriate fashion in the fabrication of the semiconductor device 102. For example, as illustrated and described hereinafter with respect to FIGS. 4–12, the phase change material 112 may be created by deposition of a film or layer of electrically switchable chalcogenide alloy formed of antimony, tellurium, and germanium, having a thickness of about 100 Å to about 1000 Å, such as about in 200 Å. The phase change material 112 also includes a memory region 12c (FIG. 2b) for use in storing data or other information in operation of the device 102. The memory region 112c comprises a portion of the volume of phase change material 112 extending between an upper portion of the upper surface 112a and a lower portion of the lower surface 112b.

The memory cell 110 further comprises a first high resistivity material 120 overlying the phase change material layer 112, wherein a first intermediate resistivity plug or portion 120a is formed to contact the upper portion of the upper surface 112a of the memory region 112c. A second high resistivity material 122 is provided under the phase change material 112 comprising a second intermediate resistivity plug or portion 122a contacting the lower portion of the lower surface 112b of the memory region 112c. The first and second high resistivity materials 120 and 122 in the illustrated cell 110 are fabricated by depositing layers of undoped polysilicon or amorphous silicon of thickness of about 0.1 $\mu$m to about 0.5 $\mu$m during processing of the device 102, although any appropriate material and thickness may be employed.

In accordance with an aspect of the present invention, the intermediate resistivity plugs 120a and 122a, moreover, can be formed by any appropriate techniques so as to provide a resistive electrical path for programming, erasing, and/or reading the information contents of the memory cell 110. For example, as described further below, the plugs 120a and/or 122a may be formed by reducing the resistivity of a portion of the high resistivity material 120, 122, such as by implanting portions of the high resistivity material layers 120 and/or 122 with boron, arsenic, or phosphorus. In this manner, the resistivity of the plugs 120a and 122a is less than that of the first and second high resistivity materials 120 and 122, respectively.

In this configuration, the phase change material in the memory region 112c and the first and second intermediate resistivity plugs 120a and 122a form an electrical path for storage and retrieval of information in the memory cell 110. Thus, where a current 114 is passed through the cell 110 (e.g., along a path including the resistive plugs 120a, 122a, and the memory region 112c), data in the cell 110 may be read or written, wherein the data may be binary or non-binary. In the exemplary device 102, the cell 110 is adapted to store binary data where a binary "0" is represented by a relatively low resistivity (e.g., generally crystalline) state of the material in the memory region 112c, and a "1" is represented by a relatively high resistivity (e.g., generally amorphous) material state in the region 112c. In operation, the cell 110 may be programmed directly to either a "1" or to a "0", regardless of the previous state, using electrical current pulses of appropriate amplitude and duration using an associated MOSFET type transistor 130 and other peripheral circuitry (not shown), as illustrated and described in greater detail below with respect to FIG. 3.

Such programming pulses thermally change the structure in the phase change material in the memory region 112c in a controlled fashion so as to leave the region 112c in a desired state after cooling. In particular, as a programming current pulse 114 of sufficient amplitude flows (e.g., approximately 200 $\mu$A or more in the exemplary cell 110), the phase change material in the region 112c melts into an amorphous state, and depending upon the length of the pulse, cools either quickly or slowly, by which the desired final material state can be achieved. Thus, where a relatively short duration current pulse is applied, the material in the region 112c cools quickly, and remains in a generally amorphous state, thereby setting or programming the cell material to a high electrical resistivity (e.g., a binary "1" in the device 102).

Conversely, where the current 114 comprises a longer duration pulse, the material 112c cools more slowly, and transitions into a generally crystalline state having a relatively low resistivity (e.g., a binary "0"). Thus, through controlling the pulse duration and the current magnitude, the phase change material in the memory region 112c of the memory cell 110 may be programmed to either an amorphous or crystalline state in order to function as a binary data store. The current 114 may further be employed in reading the cell 110, for instance, by applying a current pulse of lower magnitude (e.g., low enough to avoid disturbing the material state in the storage node), and sensing the resistivity of the cell material (e.g., and hence the value of the data stored or programmed therein).

The exemplary memory cell 110 further comprises first and second (e.g., upper and lower) conductive contact structures 140 and 142, wherein the upper contact 140 at least partially overlies the upper plug 120a and the second contact 142 at least partially underlies and contacts the lower plug 122a. The contacts 140 and 142 may be deposited as layers of metal or other conductive materials, for instance, having a thickness of about 0.1 um. As shown in FIGS. 2a and 2b, application of a voltage across the first and second conductive contacts 140 and 142 will cause a current 114 to flow in the phase change material in the memory region 112c and the resistive plugs 120a and 112a.

In contrast to the conventional cell 10 of FIGS. 1a and 1b, the cell 110 is able to achieve more uniform, efficient phase material state transitioning through the employment of the upper and lower resistive plugs 120a and 122a. Thus, for example, the cell 110 may be programmed using less energy than that required of the conventional cell. As seen in FIG. 2b, the memory region 112c affected by the programming current 114 is generally symmetrical about the plane of the phase change material layer 112, a condition which was not possible in the conventional design (e.g., region 50 of FIG. 1b), absent application of larger programming currents than are needed with the present invention. Moreover, the structure of the cell 110 mitigates conductive contacts 140 and 142 acting as heat sinks during reading or writing operations, because the phase change material 112, and particularly the memory region 112c is not in direct contact with the relatively high thermal conductivity contacts 140 and 142.

According to another aspect of the invention, the memory region 112c and the plugs 120a and 122a are aligned along a vertical axis 144. Thus, the plugs 120a and 122a are generally symmetrical with respect to one another about the plane of the phase change material 112. Thus, as shown in FIG. 2b, the memory region 112c is symmetrical about the plane of the phase change material 112, allowing reduction in the amount of current required to program the cell 110 to a level adequate to differentiate between programmed states (e.g., between a binary "0" and a binary "1"). It is noted in this regard, that if the upper and lower plugs are not aligned as illustrated, the memory region 112c may become nonsymmetrical, and may be laterally extended, in which case more energy may be needed to adequately program the cell 110.

The cell 110 is connected to the transistor 130 formed in the semiconductor memory device 102 for programming and reading of the cell 110. The lower contact 142 is connected to a first source/drain structure 132 of the transistor 130 by a conductive via structure 134, and the upper contact 140 is connected to a power supply rail connection 136 (e.g., $V_{CC}$ in FIG. 2a) by another via structure 138, by which programming and/or read current is derived using the transistor 130. The transistor 130 further includes a gate 124, such as polysilicon, which is connected through metal layer structures to row select logic devices (not shown), and a second source/drain 126 is connected to a column select line contact $C_N$ using a via structure 142.

Figure 3:
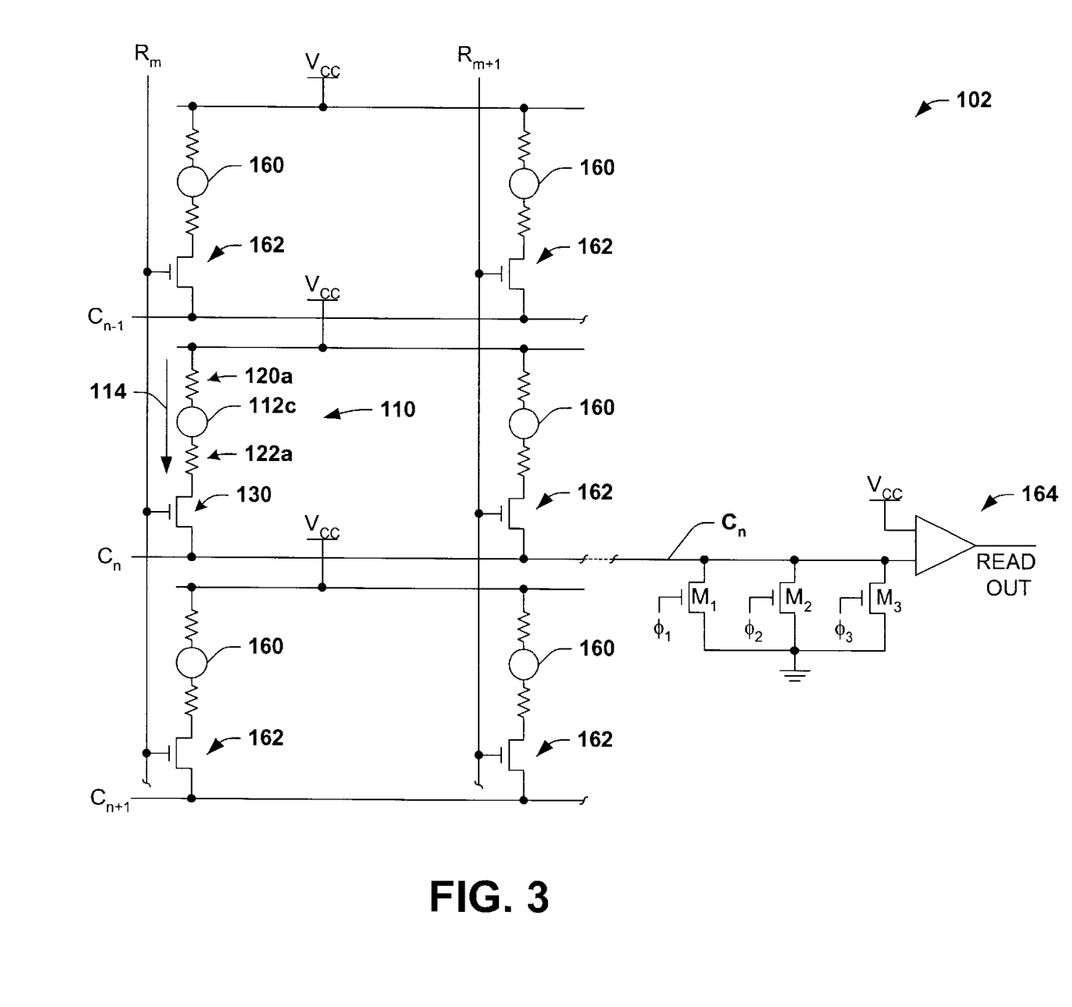
FIG. 3 is a schematic diagram illustrating a portion of a memory device with an array of phase change material memory cells in accordance with another aspect of the invention.

FIG. 3 provides a schematic illustration of an array of such phase change material memory cells in the device 102, wherein the exemplary cell 110 of FIGS. 2a and 2b is part of a memory array of dimension M×N, where M and N are integers, including other similar cells, indicated generally as 160 with associated selection transistors 162. The cells 160, 110 are configured in an array having rows R1 to $R_M$, e.g., $R_m$, $R_{m+1}$, etc., and columns $C_1$ to $C_N$ e.g., $C_{n-1}$, $C_n$, $C_{n+1}$, etc., for example, where the cell 110 is situated at row $R_m$ and column $C_n$. When the cell 110 is to be involved in a read or write operation, the row select line $R_m$ is actuated (e.g., pulled high) by row select logic (not shown) in the device 102, thereby connecting the lower resistive plug 122a to the column select line $C_n$. The column line $C_n$, in turn, is selectively employed in association with a bank of three MOSFET devices $M_1$, $M_2$, and $M_3$ in order to conduct current from the power supply $V_{CC}$ through the operative memory region 112c, the resistor plugs 120a, 122a, and the transistor 130 by connection to ground. In this regard, the sizes of the transistors $M_1$, $M_2$, and $M_3$ are designed so as to provide the desired current levels (e.g., for cell current 114) for reading the contents of the cell 110 or for programming the cell 110 to a binary "1" or "0", respectively.

In the exemplary device 102, for example, transistor $M_1$ is actuated during a read operation via a control signal $\Phi_1$ for reading the cell 110. The signal $\Phi_1$ is provided by peripheral read logic (not shown) having a pulse width or time duration of from about 0.1 ns to about 5.0 ns, where the resulting current 114 during reading is from about 1 $\mu$A to about 100 $\mu$A, as determined by the size of the transistor $M_1$. The read pulse duration of the control signal $\Phi_1$ provides time for reading a resulting signal level using a comparator device 164 to determine whether the memory region 112c is programmed to the amorphous state or to the crystalline state, without disturbing the material state in the storage node.

Transistor $M_2$ is operative to selectively provide a relatively short duration current pulse for programming the memory region 112c to a binary "1" according to a control signal $\Phi_2$. For example, in the exemplary device 102, the control signal $\Phi_2$ has a duration of about 10 ns to about 100 ns, and the size of the transistor $M_2$ provides a current 114 of about 0.5 mA to about 10 mA. Because the duration of the signal $\Phi_2$ is relatively short, the material 112c cools quickly, and remains in a generally amorphous state, thereby setting or programming the cell 110 to a high electrical resistivity (e.g., representing a binary "1" in the memory device 102). The transistor $M_3$ is used to program the cell 110 to a low resistivity state (e.g., binary "0") by providing a pulse of a duration of about 20 ns to about 500 ns via a control signal $\phi_3$, where the size of transistor $M_3$ provides current 114 at about 200 $\mu$A to about 500 $\mu$A. Because of the relatively longer duration of the pulse signal $\Phi_3$, the material in the memory region 112c cools more slowly, and transitions into a generally crystalline state having a relatively low resistivity.

Figure 4:
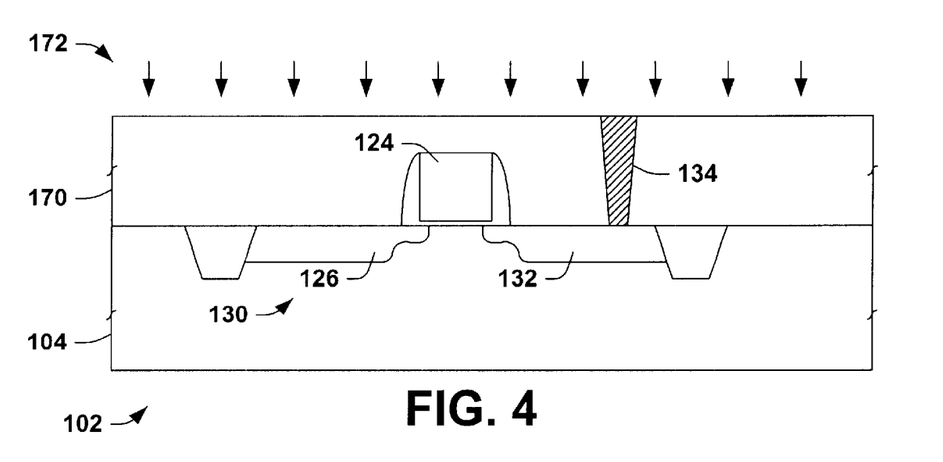
FIG. 4 is a partial side elevation view in section illustrating a semiconductor substrate having a MOSFET transistor in which a phase change material memory cell is to be formed.

Referring now to FIGS. 4–12, fabrication of an exemplary memory device and a phase change material memory cell thereof is illustrated and described below. In FIG. 4, the exemplary memory device 102 is illustrated in an early stage of processing, with the MOSFET transistor 130 (e.g., FIG. 2a) having been formed therein according to known process steps with the source/drain regions 126 and 132 formed in a semiconductor substrate 104 and the gate 124 formed thereon. An insulator layer 170 is formed over the gate 124 and the source/drain regions 126,132, with the conductive via structure 134 formed therein to contact the source/drain 132.

Figure 5:
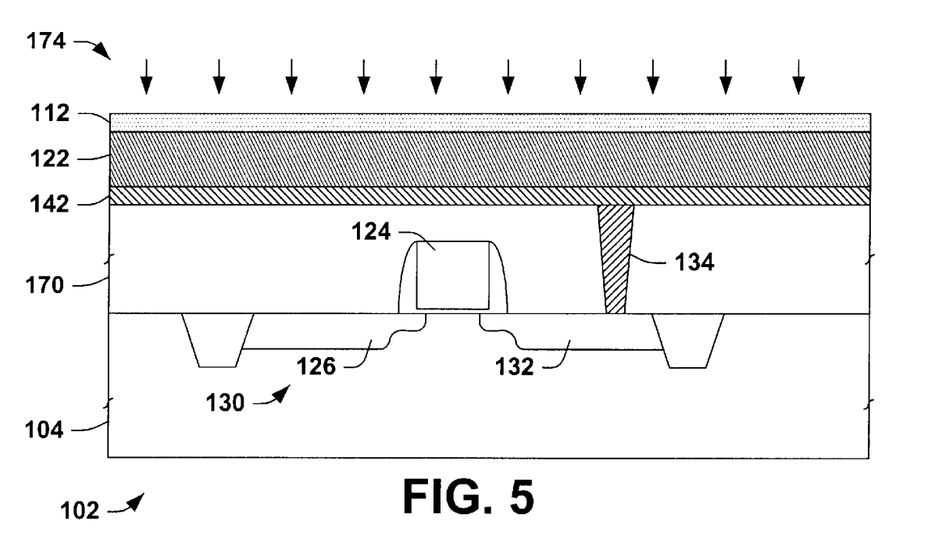
FIG. 5 is a partial side elevation view in section illustrating deposition of various layers of material in order to form the phase change material memory cell.

Several deposition processes, generally indicated as 172 are then performed to deposit a conductive layer 142 over the insulator layer 170, a layer 122 of high resistivity material over the conductive layer 142, and a phase change material layer 112 over the high resistivity material 122, which are illustrated in FIG. 5. The conductive layer 142 may be deposited using any appropriate metal or other conductive material, such as having a thickness of about 0.1 $\mu$m. The high resistivity layer 122 is deposited using any appropriate material, such as undoped polysilicon or amorphous silicon having a thickness of about 0.1 $\mu$m to about 0.5 $\mu$m. The phase change material layer or film 112 comprises, for example, a chalcogenide alloy formed of antimony, tellurium, and germanium deposited to a thickness of about 0.01 $\mu$m to about 0.1 $\mu$m over the first high resistivity layer 122, although other phase change materials and thicknesses are contemplated within the scope of the present invention.

Figure 6:
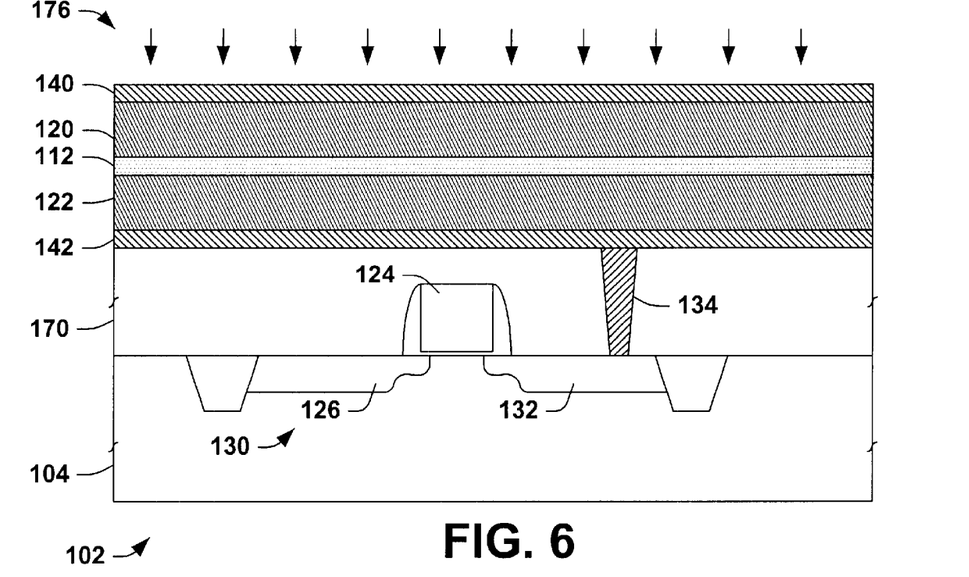
FIG. 6 is a partial side elevation view in section illustrating deposition of further materials in order to form the phase change material memory cell.

Another series of deposition steps is then performed, which are indicated generally as 174. Referring also to FIG. 6, the process steps 174 comprise depositing a second high resistivity layer 120 over the phase change material 112, and depositing a second conductive contact layer 140 over the second high resistivity material 120, for example, wherein the layer 120 may be undoped polysilicon or amorphous silicon having a thickness of about 0.1 $\mu$m to about 0.5 $\mu$m, and the contact layer 140 may be any appropriate metal or other conductive material, such as having a thickness of about 0.1 $\mu$m, similar to the layers 122, and 142, respectively.

Figure 7:
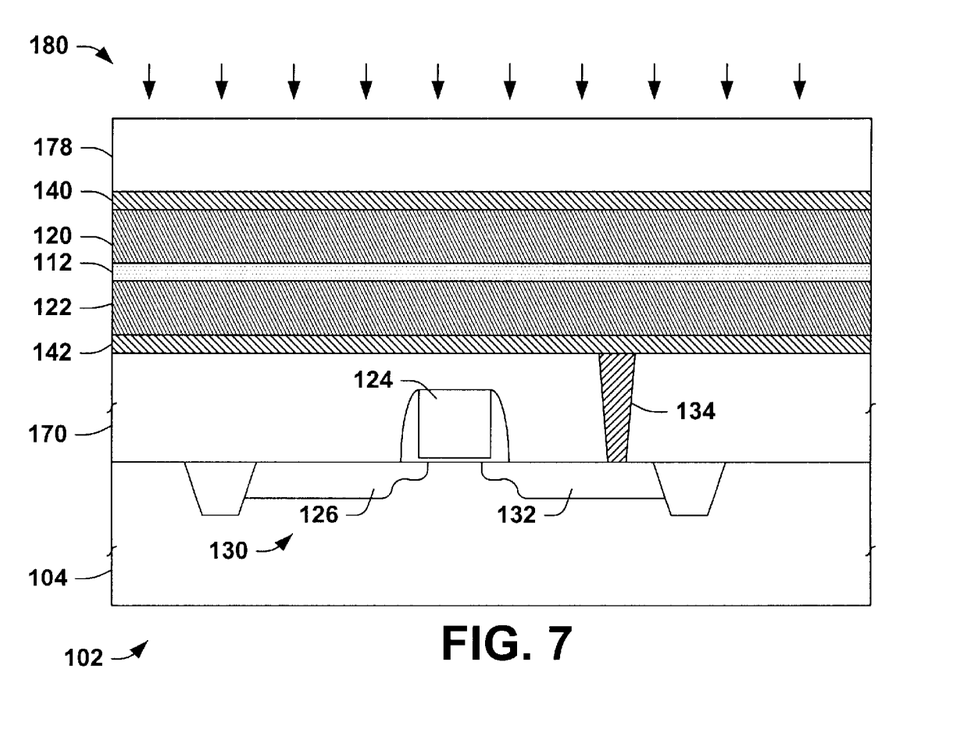
FIG. 7 is a partial side elevation view in section illustrating the semiconductor device of FIGS. 4–6 in which a mask layer is deposited.
Figure 8:
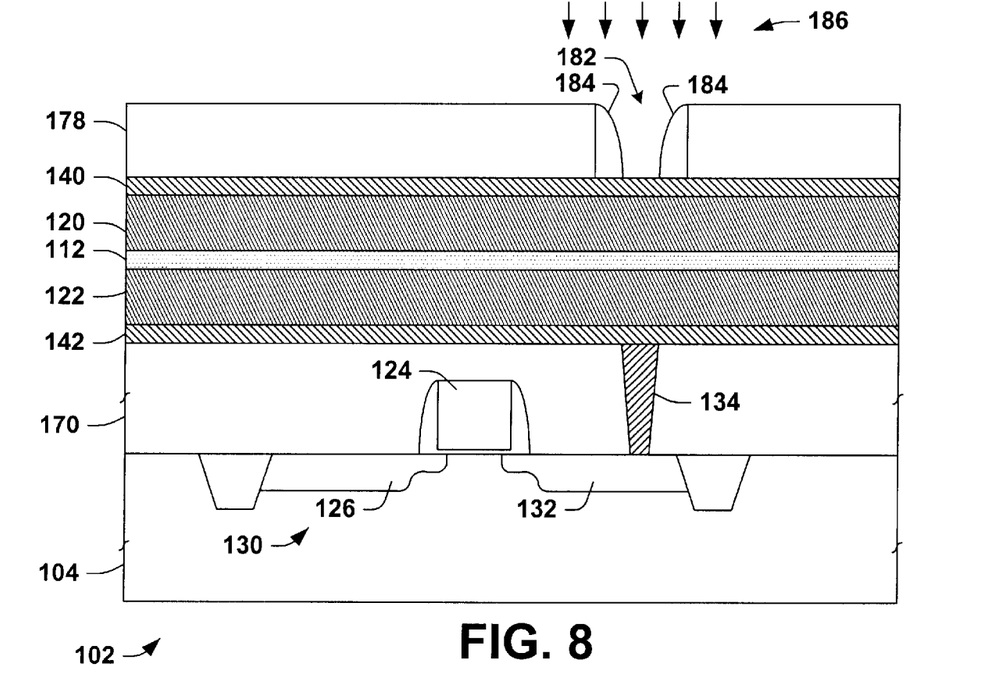
FIG. 8 is a partial side elevation view in section illustrating implantation of upper and lower resistive plugs using a patterned mask.

A deposition process 176 is then carried out to form a mask layer 178, such as oxide or nitride (e.g., SiO or SiN) of any appropriate thickness, which is illustrated in FIG. 7. A photolithographic patterning process 180 (e.g., such as exposure using a photomask, and material removal through etching) is then performed to provide an opening 182 in the mask layer 178 as shown in FIG. 8. The removal of mask material 178 may be performed, for instance, using a wet etch process. Thereafter, the opening may optionally be further refined by deposition of sidewall material, followed by an anisotropic dry etch process (not shown) in order to form sidewall mask features 184.

Figure 9:
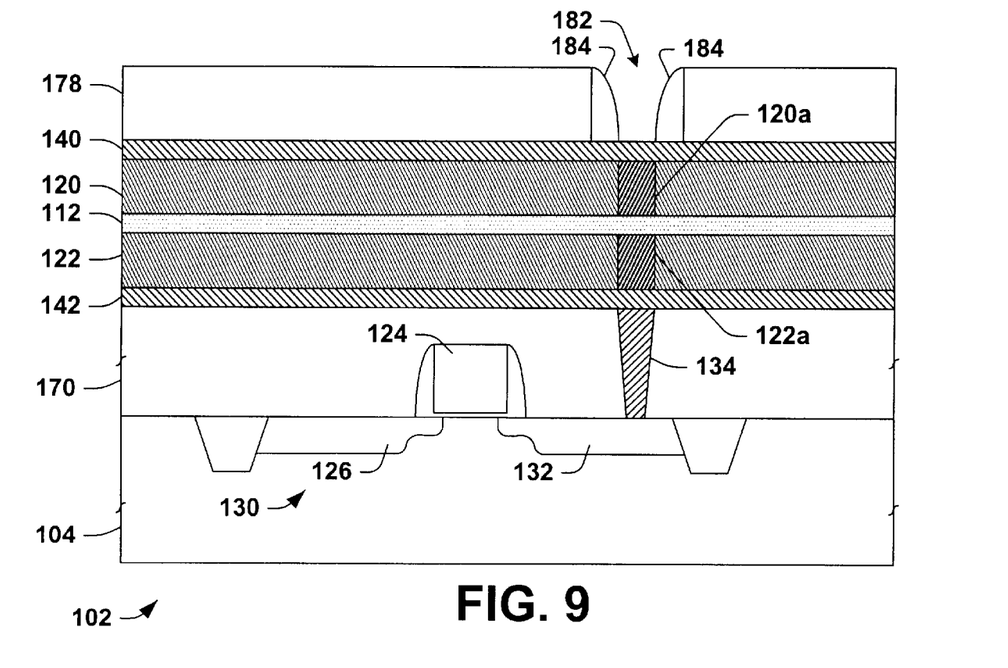
FIG. 9 is a partial side elevation view in section illustrating vertically aligned upper and lower resistive plugs implanted in accordance with another aspect of the invention.

An implantation process 186 is then employed in FIG. 8 to implant first and second regions or portions 120a and 122a of the layers 120 and 122, respectively. The implantation 186 reduces the resistivity of the portions 122a and 120a below that of the high resistivity material elsewhere in the layers 122 and 120, respectively, by which resistive plugs 122a and 120a can be used to provide controlled heating to the memory region 112c therebetween (FIG. 2b), as illustrated in FIG. 9. Furthermore, although illustrated as being implanted, the plugs 122a, 120a can alternatively be formed using any appropriate processing step(s) by which upper and lower intermediate resistivity regions or plugs are formed above and beneath the memory region 112c of the phase change material layer 112. In the illustrated device 102, for example, the resistivities of the portions 122a and 120a are reduced by implantation of boron, arsenic, or phosphorus therein.

Moreover, while illustrated as being formed via a single implantation, the plugs 122a, 120a, may alternatively be formed using separate implantations, and may be formed using separate implantation masks. However, it will be appreciated that in the illustrated device 102, the use of a single mask 178 provides for vertical alignment of the plugs 122a, 120a with respect to one another, which may advantageously improve device performance in operating on the memory region 112c therebetween. It is noted that separate implantations can be performed using the same mask 178, by which the vertical alignment of the plugs 122a, 120a can be achieved, for instance, where separate implantations facilitate precise control over the resistivities in the individual plugs 120a and 122a. In this regard, the resistances of the plugs 120a and 122a can, but need not be equal. After the implantation process 186, the remainder of the implantation mask 178 is removed.

Figure 10:
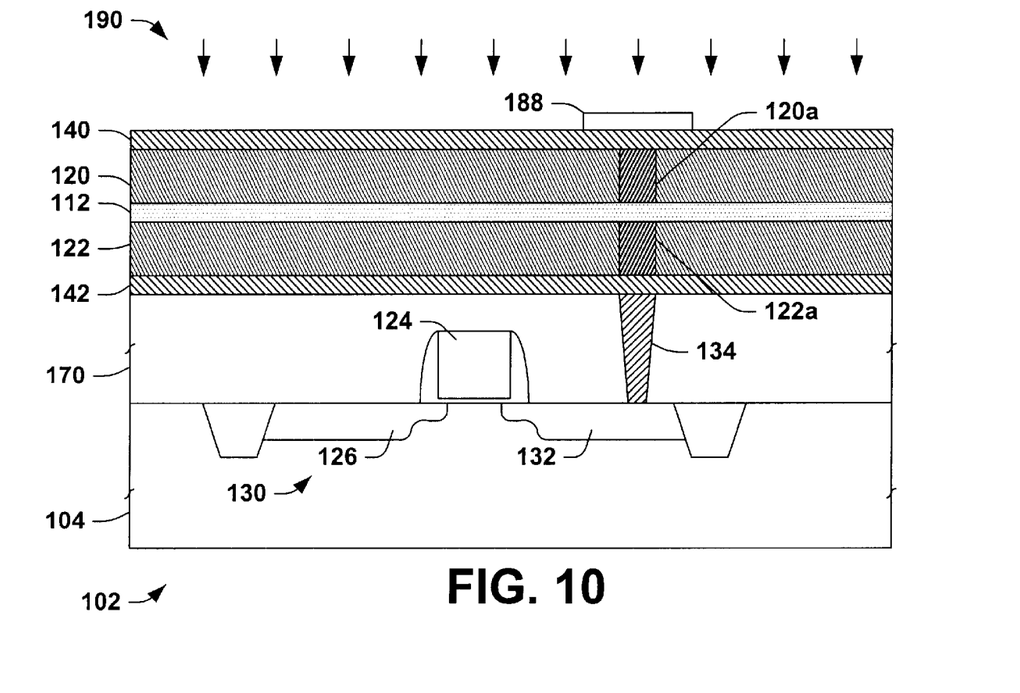
FIG. 10 is a partial side elevation view in section illustrating a patterned etch process in the formation a phase change material memory cell in the semiconductor device.
Figure 11:
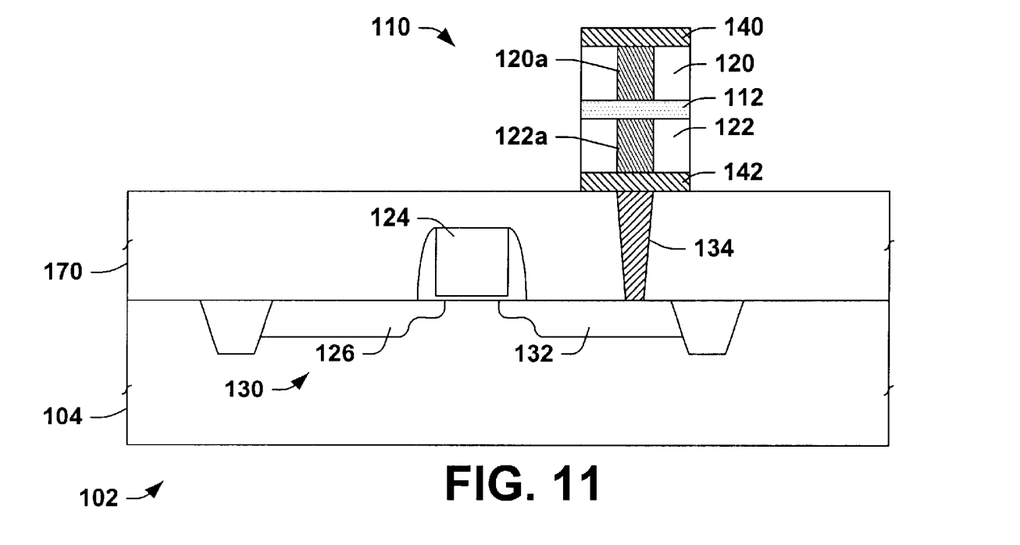
FIG. 11 is a partial side elevation view in section illustrating the phase change material memory cell structure following the patterned etch process of FIG. 10.
Figure 12:
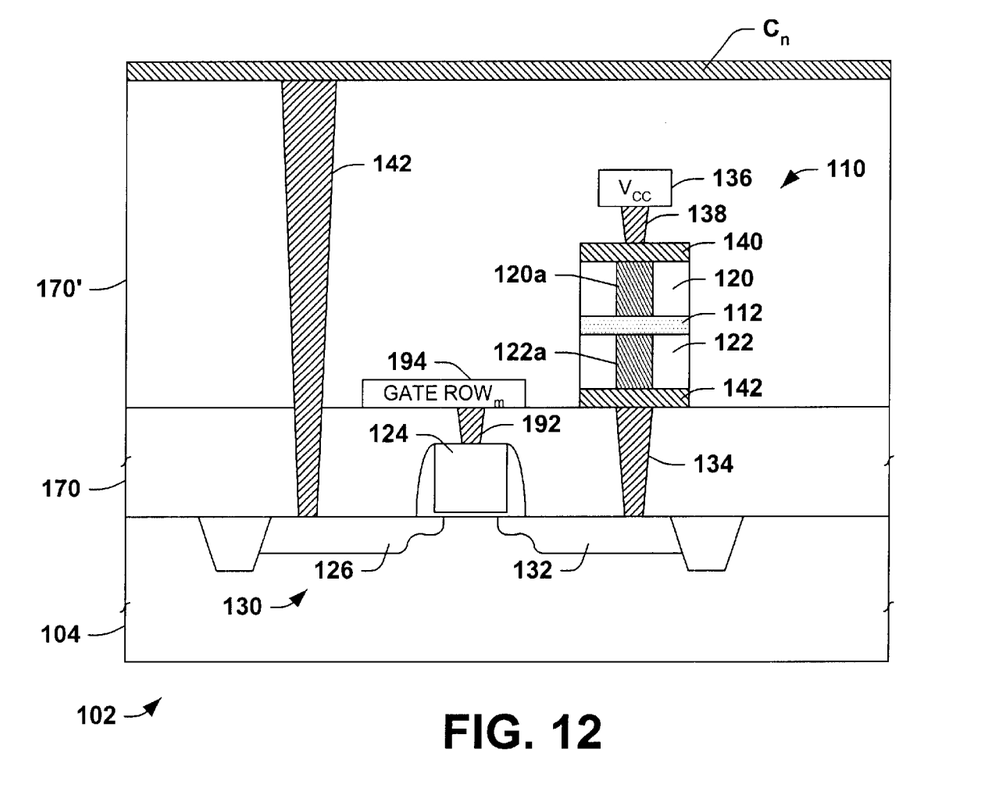
FIG. 12 is a partial side elevation view in section illustrating an exemplary phase change material memory cell structure and connections thereto in the semiconductor device in accordance with the invention.

Referring also to FIG. 10, a patterned mask 188 is then formed over the active region of the prospective memory cell (e.g., generally above the plug 120a in FIG. 10), and an etch process 190 is performed to remove exposed portions of the layers 140, 120, 112, 122, and 142, as illustrated in FIG. 11. Thus constructed, the phase change material memory cell 110 appears generally as illustrated and described above with respect to FIGS. 2a and 2b. Thereafter, as illustrated in FIG. 12, a via 192 is formed in the insulator layer 170 for contacting the gate 124 of the transistor 130, and a contact feature 194 is formed (e.g., through deposition and patterned etching processes, not shown) to connect the gate 124 to the row select signal for row $R_m$. One or more additional insulator layers 170' are then formed, along with the via 138 connecting a metal layer connection 136 from a power supply voltage $V_{CC}$ to the upper contact 140, as well as a conductive via 142 connecting the source/drain 126 to a column select line $C_n$ in still another metal layer. Further processing steps (not shown) may then be performed on the device 102 in order to complete metalization and other processing typically done to finalize the device 102.

Figure 13:
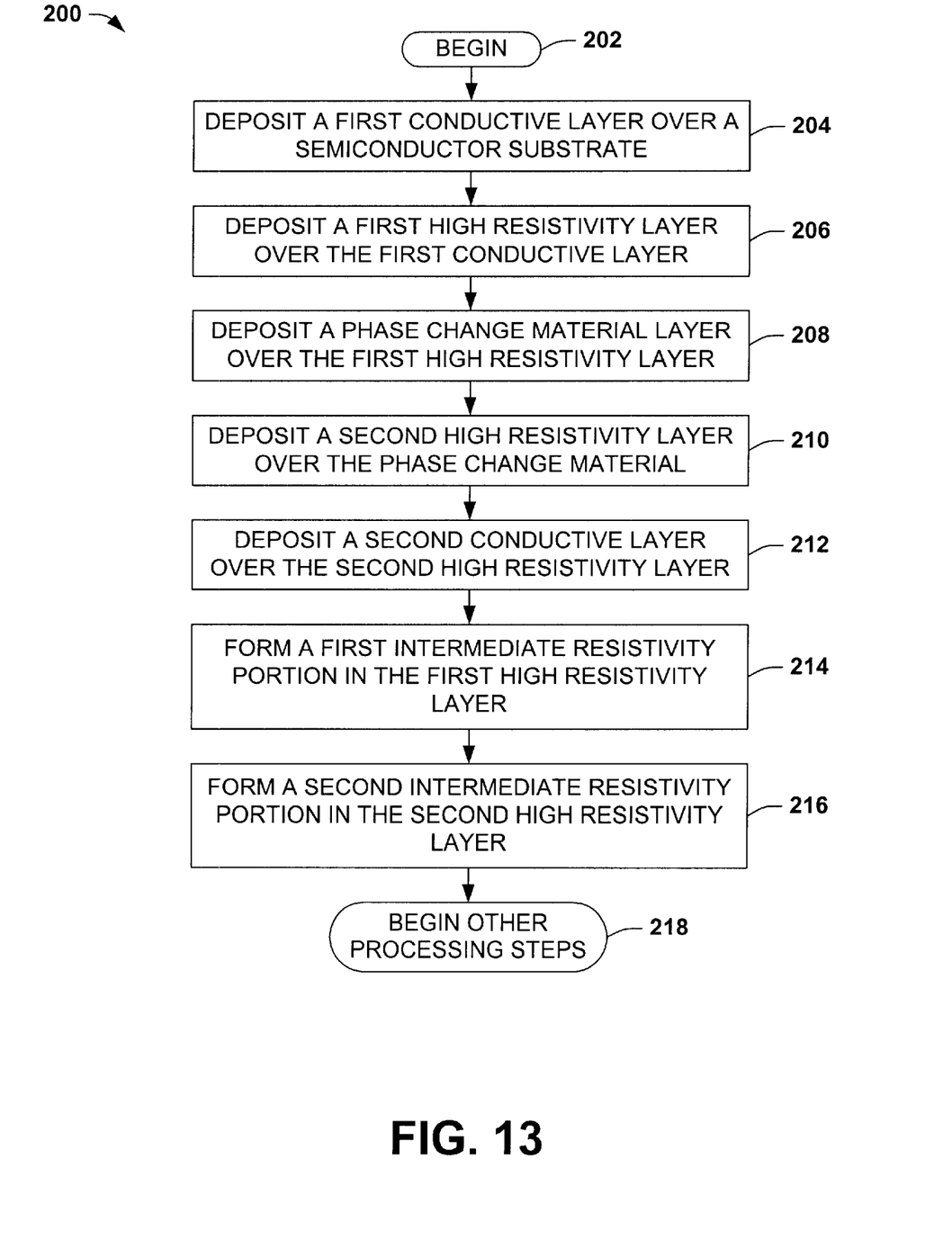
FIG. 13 is a flow diagram illustrating an exemplary method of fabricating a memory cell in a semiconductor memory device in accordance with another r aspect of the present invention.

Another aspect of the invention provides methods of fabricating a memory cell in semiconductor memory devices. An exemplary method 200 according to the invention is illustrated in FIG. 13. Although the method 200 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

Beginning at 202, the method 200 comprises depositing a first conductive layer over a semiconductor substrate at 204 and depositing a first high resistivity layer over the first conductive layer at 206. Thereafter, a volume or layer of phase change material is deposited at 208 over the first high resistivity layer. As illustrated and described above with respect to FIGS. 2a–12, the phase change material comprises a memory region extending between generally planar upper and lower surfaces of the phase change material layer.

At 210, a second high resistivity layer is deposited over the volume of phase change material, and a second conductive contact layer is deposited at 212 over the second high resistivity layer. The method proceeds at 214, where a first intermediate resistivity portion is formed in the first high resistivity layer, and at 216 a second intermediate resistivity portion is formed in the second high resistivity layer substantially above the memory region, before the method 200 ends at 218, whereafter further processing steps are undertaken (not shown).

The phase change material deposition at 208 may comprise depositing any appropriate phase change material. In one implementation, this includes depositing a chalcogenide alloy formed of antimony, tellurium, and germanium over the first high resistivity layer. The depositions at 206 and 210 of the first and second high resistivity layers may comprise depositing any appropriate material, such as undoped polysilicon or amorphous silicon of any appropriate thickness, for example, such as about 0.1 µm to about 0.5 µm. The formation of the intermediate resistivity portions at 214 and 216 may be done according to any appropriate technique, by which first and second resistivities associated therewith are reduced compared with that of the material elsewhere in the high resistivity layers. In this regard, for example, reducing the resistivities may comprise implanting boron, arsenic, or phosphorus (e.g., or other appropriate species) in the intermediate resistivity portions. In addition, this reduction may be performed in a single step, or through multiple processing operations, for example, by a single implantation or via multiple implantations. As noted above with respect to the mask 178 of FIGS. 8 and 9, the implantation(s) may advantageously be done using a single mask, in order to achieve vertical alignment of the upper and lower resistive plugs or intermediate resistivity portions in the memory device.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A memory cell for storage and retrieval of information in a memory device, comprising:

volume of phase change material disposed in a semiconductor device and comprising a generally planar upper surface and a generally planar lower surface and a memory region comprising a portion of the volume of phase change material extending between an upper portion of the upper surface and a lower portion of the lower surface;

first high resistivity material at least partially overlying the volume of phase change material and comprising a first intermediate resistivity portion contacting the upper portion of the upper surface of the memory region; and second high resistivity material at least partially underlying the volume of phase change material and comprising a second intermediate resistivity portion contacting the lower portion of the lower surface of the memory region;

wherein phase change material in the memory region and the first and second intermediate resistivity portions form an electrical path for storage and retrieval of information in the memory cell.

2. The memory cell of claim 1, further comprising:

first conductive contact structure at least partially overlying the first intermediate resistivity portion of the first high resistivity material and electrically contacting the first intermediate resistivity portion; and second conductive contact structure at least partially underlying the second intermediate resistivity portion of the second high resistivity material and electrically contacting the second intermediate resistivity portion;

wherein an applied voltage across the first and second conductive contact structures causes a current to flow in the phase change material in the memory region and the first and second intermediate resistivity portions.

3. The memory cell of claim 2, wherein at least one of the first and second intermediate resistivity portions comprise high resistivity material implanted with at least one of boron, arsenic, and phosphorus, and wherein a resistivity associated with the at least one of the first and second intermediate resistivity portions is less than a resistivity associated with one of the first and second high resistivity materials.

4. The memory cell of claim 3, wherein the memory region and the first and second intermediate resistivity portions are aligned along a vertical axis.

5. The memory cell of claim 2, wherein the volume of phase change material comprises an electrically switchable chalcogenide alloy formed of antimony, tellurium, and germanium, wherein the first and second high resistivity materials comprise one of undoped polysilicon and amorphous silicon, and wherein at least one of the first and second intermediate resistivity portions comprise high resistivity material implanted with at least one of boron, arsenic, and phosphorus.

6. The memory cell of claim 2, wherein the volume of phase change material is located in a generally horizontal plane and wherein the first and second intermediate resistivity portions are symmetrical with respect to one another about the plane.

7. The memory cell of claim 1, wherein at least one of the first and second intermediate resistivity portions comprises high resistivity material implanted with at least one of boron, arsenic, and phosphorus, and wherein a resistivity associated with the at least one of the first and second intermediate resistivity portions is less than a resistivity associated with one of the first and second high resistivity materials.

8. The memory cell of claim 1, wherein the memory region and the first and second intermediate resistivity portions are aligned along a vertical axis.

9. The memory cell of claim 1, wherein the volume of phase change material comprises an electrically switchable chalcogenide alloy formed of antimony, tellurium, and germanium, wherein the first and second high resistivity materials comprise one of undoped polysilicon and amorphous silicon, and wherein at least one of the first and second intermediate resistivity portions comprises high resistivity material implanted with at least one of boron, arsenic, and phosphorus.

10. The memory cell of claim 1, wherein the volume of phase change material is located in a generally horizontal plane and wherein the first and second intermediate resistivity portions are symmetrical with respect to one another about the plane.

11. A memory device for storage and retrieval of information, comprising:
   an array of electrically programmable and erasable memory cells individually operative for storage and retrieval at least one data bit; and
   means for reading and writing the array of memory cells;
   wherein at least one of the memory cells comprises:
      volume of phase change material disposed in a semiconductor device and comprising a generally planar upper surface and a generally planar lower surface and a memory region comprising a portion of the volume of phase change material extending between an upper portion of the upper surface and a lower portion of the lower surface;
      first high resistivity material at least partially overlying the volume of phase change material and comprising a first intermediate resistivity portion contacting the upper portion of the upper surface of the memory region; and
      second high resistivity material at least partially underlying the volume of phase change material and comprising a second intermediate resistivity portion contacting the lower portion of the lower surface of the memory region.

12. The memory device of claim 11, wherein phase change material in the memory region and the first and second intermediate resistivity portions form an electrical path for storage and retrieval of information in the at least one of the memory cells.

13. The memory device of claim 11, wherein at least one of the first and second intermediate resistivity portions comprises high resistivity material implanted with at least one of boron, arsenic, and phosphorus, and wherein a resistivity associated with the at least one of the first and second intermediate resistivity portions is less than a resistivity associated with one of the first and second high resistivity materials.

14. The memory device of claim 11, wherein the memory region and the first and second intermediate resistivity portions are aligned along a vertical axis.

15. The memory device of claim 11, wherein the volume of phase change material comprises an electrically switchable chalcogenide alloy formed of antimony, tellurium, and germanium, wherein the first and second high resistivity materials comprise one of undoped polysilicon and amorphous silicon, and wherein at least one of the first and second intermediate resistivity portions comprises high resistivity material implanted with at least one of boron, arsenic, and phosphorus.

16. A method of fabricating a memory cell in a semiconductor memory device, comprising:
   providing a semiconductor substrate;
   depositing a first conductive contact layer over the substrate;
   depositing a first high resistivity layer over the first conductive contact layer;
   depositing a volume of phase change material over the first high resistivity layer, the volume of phase change material comprising a memory region comprising a portion of the volume of phase change material extending between generally planar upper and lower surfaces of the volume of phase change material;
   depositing a second high resistivity layer over the volume of phase change material;
   depositing a second conductive contact layer over the second high resistivity layer;
   forming a first intermediate resistivity portion in the first high resistivity layer substantially beneath the memory region; and
   forming a second intermediate resistivity portion in the second high resistivity layer substantially above the memory region.

17. The method of claim 16, wherein depositing the first and second high resistivity layers comprises depositing one of undoped polysilicon and amorphous silicon.

18. The method of claim 16, wherein depositing the volume of phase change material comprises depositing a chalcogenide alloy formed of antimony, tellurium, and germanium over the first high resistivity layer.

19. The method of claim 16, wherein forming the first and second intermediate resistivity portions comprises reducing first and second resistivities associated with the first and second intermediate resistivity portions of the first and second high resistivity layers, respectively.

20. The method of claim 19, wherein reducing the first resistivity of the first intermediate resistivity portion comprises implanting at least one of boron, arsenic, and phosphorus in the first intermediate resistivity portion.

21. The method of claim 19, wherein reducing the second resistivity of the second intermediate resistivity portion comprises implanting at least one of boron, arsenic, and phosphorus in the second intermediate resistivity portion.

22. The method of claim 19, wherein reducing the first and second resistivities comprises implanting at least one of boron, arsenic, and phosphorus in the first and second intermediate resistivity portions using a single implantation process.

23. The method of claim 22, wherein implanting at least one of boron, arsenic, and phosphorus in the first and second intermediate resistivity portions comprises implanting the first and second intermediate resistivity portions using a single mask, and wherein the first and second intermediate resistivity portions are vertically aligned with respect to one another.

* * * * *